United States Patent [19]
Zojer

[11] Patent Number: 5,723,996
[45] Date of Patent: Mar. 3, 1998

[54] LEADFRAME FOR PLASTIC-ENCAPSULATED SEMICONDUCTOR DEVICE, SEMICONDUCTORDEVICE USING THE SAME, AND MANUFACTURING METHOD FOR THE LEADFRAME

[75] Inventor: Bernhard Zojer, Villach, Austria

[73] Assignee: Siemens Aktiengesellschaft, Munich, Germany

[21] Appl. No.: 601,066

[22] Filed: Feb. 12, 1996

[30] Foreign Application Priority Data

Feb. 10, 1995 [DE] Germany .................. 195 04 480.0

[51] Int. Cl.[6] .................................................. H03K 17/04
[52] U.S. Cl. .................. 327/432; 327/365; 327/431; 327/564; 327/433
[58] Field of Search .......................... 327/365, 419, 327/424, 427, 433, 434, 442, 564, 565, 566, 432; 257/328, 337

[56] References Cited

U.S. PATENT DOCUMENTS

| | | | |
|---|---|---|---|
| 4,926,074 | 5/1990 | Singer et al. | 327/434 |
| 4,939,566 | 7/1990 | Singer et al. | 357/41 |
| 5,023,493 | 6/1991 | Wrzesinski | 327/424 |
| 5,202,276 | 4/1993 | Malhi | 437/41 |

*Primary Examiner*—Timothy P. Callahan
*Assistant Examiner*—Dinh T. Le
*Attorney, Agent, or Firm*—Herbert L. Lerner; Laurence A. Greenberg

[57] ABSTRACT

An integratable reversing switch selectively imposes a ground potential or a supply potential being positive relative thereto upon a terminal of a load having another terminal being connected to a supply potential that is negative relative to the ground potential. A first switch is connected between the load and the positive supply potential. A second switch is controlled in complementary fashion thereto and is connected between the load and the ground potential. The second switch is formed by an inversely operated DMOS field effect transistor.

2 Claims, 1 Drawing Sheet

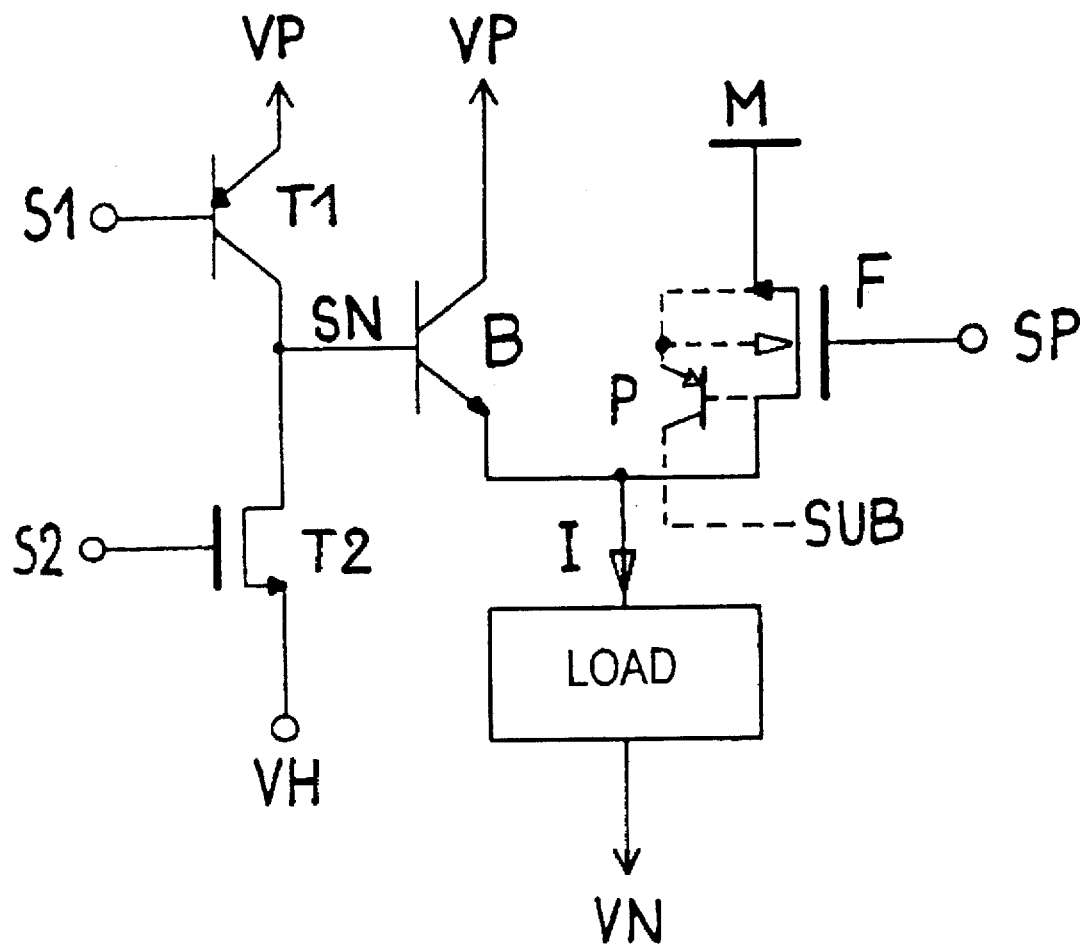
FIGURE

LEADFRAME FOR PLASTIC-ENCAPSULATED SEMICONDUCTOR DEVICE, SEMICONDUCTOR DEVICE USING THE SAME, AND MANUFACTURING METHOD FOR THE LEADFRAME

BACKGROUND OF THE INVENTION

Field of the Invention

The invention relates to an integratable reversing switch for selective imposition of a ground potential or of a supply potential that is positive relative thereto upon one terminal of a load having another terminal connected to a supply potential being negative relative to the ground potential.

For example, in the operation of integrated line adaptation circuits in telephone networks, it is necessary for the voltage required for supply to the adaptation circuit to be switched over between two different values. To that end, one terminal of the circuit is permanently connected to one pole, typically the negative pole, of a battery, while the other terminal is connected either to the other (positive) pole of the battery or through a connection to ground it is connected to a comparatively lower voltage, typically half the battery voltage. Accordingly, the battery together with ground forms a bipolar voltage supply, which by way of example generates two voltages of ±80 V that are symmetrical relative to ground, and depending on the switching state of the reversing switch, either 80 V or 160 V is applied to the integrated circuit. In order to keep the expenditure for external circuitry as low as possible, the goal is generally to integrate the reversing switch and particularly to integrate it into the adaptation circuit itself. The reversing switch should have a low internal resistance and thus a low voltage drop, a high voltage strength combined with low sensitivity to overvoltages, and a negligible storage performance.

SUMMARY OF THE INVENTION

It is accordingly an object of the invention to provide an integratable reversing switch for elevated voltages, which overcomes the hereinafore-mentioned disadvantages of the heretofore-known devices of this general type.

With the foregoing and other objects in view there is provided, in accordance with the invention, an integratable reversing switch, comprising a load, the load having one load terminal for selectively receiving a ground potential and a supply potential being positive relative to the ground potential, and the load having another load terminal being connected to a supply potential being negative relative to the ground potential; a first switch being connected to the positive supply potential and to the one load terminal; an n-channel DMOS field effect transistor forming a second switch having a source terminal connected to the ground potential, a drain terminal connected to the one load terminal and a gate terminal for receiving virtually the ground potential to generate a blocking switching state and for receiving a control potential being positive relative to the ground potential to generate a conductive switching state, the DMOS field effect transistor having bulk, drain and substrate terminals forming a pnp parasitic bipolar transistor, and the DMOS field effect transistor having an on-state resistance being so low that a decreasing source-to-drain voltage remains lower than a base-to-emitter threshold voltage of the pnp parasitic bipolar transistor, at a maximal source-to-drain current; and the two switches having switching states each occurring in opposition to the other.

In accordance with a concomitant feature of the invention, the first switch is constructed of a bipolar transistor of the npn type having a collector terminal which is connected to the positive supply potential, an emitter terminal that is coupled with the first load terminal, and a base terminal to which a control potential that is positive relative to the ground potential is applied for generating the conductive switching state, and to which a control potential that is negative relative to the ground potential is applied for generating the blocking switching state.

Other features which are considered as characteristic for the invention are set forth in the appended claims.

Although the invention is illustrated and described herein as embodied in an integratable reversing switch for elevated voltages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The figure of the drawing is a schematic circuit diagram of an exemplary embodiment of the invention.

DESCRIPTION OF THE PREFERRED EMBODIMENTS

Referring now to the single figure of the drawing in detail, there is seen an exemplary embodiment of an integratable reversing switch which includes a DMOS field effect transistor F of the n-channel type having a source terminal which is connected to a ground potential M and having a gate terminal to which a control signal SP is applied. A bipolar transistor B of the npn type that is also provided has a collector terminal which is connected to a positive supply potential VP and a base terminal to which a control signal SN is applied. An emitter terminal of the bipolar transistor B and a drain terminal of the field effect transistor F are coupled with one another and form a switch output of the reversing switch. A load L which includes an integrated circuit, by way of example, is connected between the switch output and a negative supply potential VN. The load L draws a current I which at most can assume a value $I_{max}$.

The control signals SP and SN carry two different control potentials each, in accordance with two switching states of the field effect transistor F and the bipolar transistor B. The control signal SP assumes a value which is sufficient for complete blocking, in the vicinity of the ground potential M, in order to generate a blocking switching state. In order to generate a conductive switching state, it carries a potential which is sufficiently positive with respect to the ground potential M to ensure that at a maximum source-to-drain current, the dropping source-to-drain voltage at the correspondingly constructed field effect transistor F remains lower than a base-to-emitter threshold voltage of a parasitic bipolar transistor P of the pnp type which is formed by the bulk, drain and substrate terminal SUB of the field effect transistor F.

In order to turn on the bipolar transistor B as completely as possible, the control signal SN for generating the conductive switching state carries an adequately positive potential, which by way of example is near the positive supply potential VP. In order to generate the blocking switching state, through the use of the control signal SN, a potential that is negative relative to the ground potential M is applied. The control signals SP and SN are adapted to one another in such a way that one transistor conducts when the other blocks, and vice versa.

The reversing switch thus includes two ON/OFF switches controlled inversely to one another, one of which is connected between the load L and the ground potential M and the other of which is connected between the load L and the positive supply potential VP. The switch between the load L and the ground potential M is formed by the DMOS field effect transistor F being operated inversely in the ON state. The channel of the field effect transistor must be selected to be large enough to ensure that a voltage which remains lower than the diode threshold of the base-to-emitter diode of the parasitic transistor P drops at the channel resistor in the conducting state of the field effect transistor at the maximal source-to-drain current. A logic signal that carries a positive potential of 5 V relative to the ground potential M in the conducting field effect transistor F and is approximately equal to the ground potential M in the blocking field effect transistor, can therefore be used as the control signal SP.

In the case of the switch located between the load L and the positive supply potential VP, it would conventionally be necessary to use a bipolar transistor, which upon being triggered with potentials equal to or greater than the ground potential M has a breakdown voltage between the collector and the emitter which is greater than the difference between the positive supply potential VP and the ground potential M. Often, though, this is not the case. Nevertheless, in most transistors, the breakdown voltage between the collector and the base is markedly higher than the breakdown voltage between the collector and the emitter. This property is exploited in the present instance by providing that in the OFF state, the base of the bipolar transistor B is acted upon by a potential which is negative relative to the ground potential M, while the emitter is kept approximately at the ground potential M as a consequence of the conducting field effect transistor F. In the case of the breakdown resistance, in this case it is the breakdown voltage between the collector and the base of the bipolar transistor B that is relevant. The breakdown resistance of the switch between the load L and the positive supply potential VP is thereby raised overall. At typical supply potentials of +80 V or −80 V the control signal SN carries a potential of +80 V relative to the ground potential M in the conducting state of the bipolar transistor B, for instance, and of −5 V relative to ground potential M in the blocking state.

These values, however, depend on the particular dimensioning and the particular application both for the bipolar transistor B and the field effect transistor F and must be adapted accordingly. The use of npn or n-channel transistors has the advantage making the particular ON-state resistance lower than with comparable pnp or p-channel transistors.

Finally, a configuration for generating the control signal SN is shown for the exemplary embodiment. In this case a bipolar transistor T1 of the pnp type is connected through its emitter terminal to the positive supply potential VP and through its collector terminal to the base terminal of the bipolar transistor B. A DMOS field effect transistor T2 of the p-channel type is coupled through its drain terminal to the base terminal of the bipolar transistor B and through its source terminal to an auxiliary potential VH that is negative relative to the ground potential M. Through the use of control signals S1 and S2 which are applied to the base terminal of the bipolar transistor T1 and to the gate terminal of the field effect transistor T2, respectively, the transistors T1 and T2 are triggered in complementary fashion and apply either approximately the positive supply potential VP or approximately the negative auxiliary potential VH to the base terminal of the bipolar transistor B. In the case of the dimensions given above as examples, the positive supply potential VP should accordingly be made equal to +80 V and a negative auxiliary potential VH should be made equal to −5 V.

I claim:

1. An integratable reversing switch, comprising:

a load, said load having one load terminal for selectively receiving a ground potential and a first supply potential being positive relative to the ground potential, and said load having another load terminal being connected to a second supply potential being negative relative to the ground potential;

a first switch being connected to the first supply potential V and to the one load terminal;

an n-channel DMOS field effect transistor forming a second switch having a source terminal connected to the ground potential, a drain terminal connected to the one load terminal and a gate terminal for receiving a blocking potential voltage being substantially equal to the ground potential to generate a blocking switch state and for receiving a first control potential voltage being positive relative to the ground potential to generate a conductive switching state, said DMOS field effect transistor further having bulk and substrate terminals thus forming a pnp parasitic bipolar transistor having emitter, base and collector terminals formed by said bulk, said drain and said substrate terminals, respectively, of said DMOS field effect transistor, said DMOS field effect transistor having an on-state resistance being so low that, at a maximum source-to-drain current, a source-to-drain voltage drop remains lower than a base-to-emitter threshold voltage of said pnp parasitic bipolar transistor; and said two switches having switching states each occurring in opposition to the other.

2. The reversing switch according to claim 1, wherein said first switch is an npn bipolar transistor having a collector terminal being connected to the first supply potential, an emitter terminal being coupled with the one load terminal, and a base terminal for receiving a second control potential voltage being positive relative to the ground potential to generate the conductive switching state and for receiving a third control potential voltage being negative relative to the ground potential to generate the blocking switching state.

* * * * *